(12) United States Patent
Yamauchi

(10) Patent No.: US 6,486,722 B2
(45) Date of Patent: Nov. 26, 2002

(54) SEMICONDUCTOR DEVICE INCLUDING A CONTROL SIGNAL GENERATION CIRCUIT ALLOWING REDUCTION IN SIZE

(75) Inventor: Tadaaki Yamauchi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/117,211

(22) Filed: Apr. 8, 2002

(65) Prior Publication Data

US 2002/0109538 A1 Aug. 15, 2002

Related U.S. Application Data

(62) Division of application No. 09/704,547, filed on Nov. 3, 2000.

(30) Foreign Application Priority Data

Nov. 22, 1999 (JP) .............................................. 11-331573
Jun. 6, 2000 (JP) ........................................ 2000-169137

(51) Int. Cl.$^7$ ................................................ H03H 11/26
(52) U.S. Cl. ....................... 327/270; 327/271; 327/269; 327/284
(58) Field of Search ................................ 327/263, 264, 327/269, 270, 271, 272, 284, 285, 393, 395, 400, 401; 365/194, 193, 191

(56) References Cited

U.S. PATENT DOCUMENTS

| | | | | |
|---|---|---|---|---|
| 5,087,829 A | * | 2/1992 | Ishibashi et al. ............. | 327/270 |
| 5,463,337 A | * | 10/1995 | Leonowich .................. | 327/269 |
| 5,812,626 A | * | 9/1998 | Kusumoto et al. .......... | 327/271 |
| 5,942,937 A | * | 8/1999 | Bell ............................ | 327/270 |
| 6,084,453 A | * | 7/2000 | Fuse et al. ................... | 327/271 |

FOREIGN PATENT DOCUMENTS

JP        11-238381        8/1999

* cited by examiner

Primary Examiner—Terry D. Cunningham
Assistant Examiner—Long Nguyen
(74) Attorney, Agent, or Firm—McDermott, Will & Emery

(57) ABSTRACT

A control signal generation circuit according to the present invention includes a plurality of control circuits supplying different internal control signals as outputs, respectively, and a common delay circuit. The common delay circuit includes a plurality of delay circuits for delaying a control signal serving as a reference. These delay circuits are connected in series and output signals of respective delay circuits can be taken out through taps provided corresponding thereto. Each of the plurality of control circuits sets a signal level of a corresponding internal control signal according to the change in a signal level of a corresponding tap.

3 Claims, 14 Drawing Sheets

SEMICONDUCTOR DEVICE INCLUDING A CONTROL SIGNAL GENERATION CIRCUIT ALLOWING REDUCTION IN SIZE

This application is a divisional of U.S. patent application Ser. No. 09/704,547, filed Nov. 3, 2000.

BACKGROUND OF THE INVENTION

1. Field of the Invention

The present invention relates to a control signal generation circuit, and more particularly to a favorable structure of the control signal generation circuit for generating an internal control signal of a semiconductor device.

2. Description of the Background Art

In semiconductor devices including memory devices, generally a circuit supplying a control signal as an output is provided for the generation of an internal control signal which is employed for the control of a series of internal operations sequentially performed at a predetermined timing.

In a control signal generation circuit in a DRAM (Dynamic Random Access Memory), for example, first, command control signals such as /RAS, /CAS and /WE signals are supplied from an external source, then a command is generated according to the combination thereof, and a plurality of internal control signals are sequentially activated for carrying out a series of operations corresponding to the command.

FIG. 14 is a circuit diagram showing a structure of a control signal generation circuit 510 which is an example of a control circuit for generating a read command in the DRAM.

With reference to FIG. 14, control signal generation circuit 510 includes a logic gate LG50 supplying the result of an AND operation as an output according to the combination of signal levels of command control signals such as /RAS, /CAS, and so on supplied as inputs, a logic gate LG52 supplying the result of an OR operation of the output results from logic gates LG50 and LG54, and an edge trigger flip flop 515 taking in the output of logic gate LG52 in response to the rising edge of a clock signal CLK and determining the signal level of a read command signal READ.

Read command signal READ is activated (to an H level) when the read command is designated. A burst operation end signal /BSTEND is a signal which is set to an H level at the start of the reading operation and set to an L level at the end of the burst operation. Logic gate LG54 supplies the result of the AND operation of read command signal READ and burst operation end signal /BSTEND as an output. Thus the output of logic gate LG54 is set to an H level at the start of the reading operation and maintained at an H level until the end of the burst operation.

Therefore, when the read command is designated by the combination of command control signals supplied as inputs to logic gate LG50, read command signal READ is set to an H level by flip flop 515 at the rise of clock signal CLK.

After the reading operation is started, the output of logic gate LG54 is turned to an L level in response to the end of the burst operation. Through taking in the L level output via logic gate LG52 from LG54 at the rising edge of clock signal CLK, flip flop 515 resets read command signal READ to an L level.

Logic gate LG50 receives a row address strobe signal /RAS, a column address strobe signal /CAS, a chip select signal /CS and a write enable signal /WE. The combination of L level /CAS and /CS signals and H level /RAS and /WE signals designates the read command and causes the output of logic gate LG50 to be set to an H level.

In response to the activation of read command signal READ supplied as an output from control signal generation circuit 510, various internal control signals are activated to carry out the operation according to the read command. As an example, the generation of internal control signals for a column-related reading operation of the DRAM will be described below.

FIG. 15 is a circuit diagram showing a structure of a control signal generation circuit 520 supplying as an output a preamplifier activation signal PAE, which is one of internal control signals relating to the column-related reading operation.

With reference to FIG. 15, control signal generation circuit 520 includes a delay circuit 522 receiving clock signal CLK and supplying clock signal CLK delayed by a delay time td0 as an output, a logic gate LG60 supplying the result of an AND operation of read command signal READ and the output of delay circuit 522, a delay circuit 524 delaying the output of logic gate LG60 (by a delay time td1), a delay circuit 526 delaying the output of delay circuit 524 (by a delay time td2) and a logic gate LG62 carrying out an AND operation of the outputs of delay circuits 524 and 526. Logic gate LG62 supplies preamplifier activation signal PAE as an output.

FIG. 16 is a circuit diagram showing a structure of a control signal generation circuit 530 generating a column decoder activation signal CDE, which is one of the control signals relating to the column-related reading operation like the preamplifier activation signal.

With reference to FIG. 16, control signal generation circuit 530 supplies column decoder activation signal CDE according to read command signal READ and clock signal CLK, similarly to control signal generation circuit 520.

Though control signal generation circuit 530 has a similar structure to control signal generation circuit 520, differences exist in that delay circuits 522, 524 and 526 in control signal generation circuit 520 are replaced with delay circuits 532, 534 and 536 for adding different delay times td3, td4 and td5, respectively, in control signal generation circuit 530, and that control signal generation circuit 530 includes an OR gate as a logic gate LG66 for supplying control signal CDE as an output.

The activation and inactivation of internal control signals, including PAE and CDE are required to be carried out at appropriate timing for the correct reading operation. The timing is adjusted through the suitable setting of delay time added by a group of delay circuits to a reference control signal, which is obtained as the result of AND operation of read command signal READ and the signal obtained by delaying clock signal CLK.

FIG. 17 is a timing chart referenced for describing operations of control signal generation circuits 520 and 530.

As shown in FIG. 17, when the read command is designated according to the combination of command control signals /RAS, /CAS, /CS and /WE, the read command is taken in at the time of the rise of clock signal CLK at time t0. At time td1, that is, tdR after time t0, read command signal READ is activated (to an H level) by control signal generation circuit 510.

When the sum of delay time added by delay circuit 522 to clock signal CLK and delay time added by delay circuits 524 and 526 to the output of logic gate LG60, that is, td0+td1+ td2, has passed after time t0, preamplifier activation signal PAE is activated (to an H level) at time t3. On the other hand, the fall of clock signal CLK is transmitted to logic gate LG62 after the time delay td0+td1. Hence, provided that the activation period of clock signal CLK is Tw, preamplifier activation signal PAE is maintained at an active state (H level) for the duration of Tw–td2 and then attains an inactive state (L level) at time t4.

Column decoder activation signal CDE is activated (to an H level) in response to the rise of clock signal CLK at time t2, that is, the sum of delay time added at delay circuits 532 and 534, td3+td4, has elapsed after time t0.

The falling edge of clock signal CLK is transmitted to logic gate LG66 via delay circuits 532 and 534 in a similar manner. As delay time td5 is further added to one input to logic gate LG66 by delay circuit 536, column decoder activation signal CDE is maintained at an active state for the duration of Tw+td5 and inactivated (to an L level) again at time t5.

Thereafter, while read command signal READ is in an active state, the activation and inactivation of these control signals are carried out at the timing as described above in response to the rising and falling edges of clock signal CLK.

In control signal generation circuits 510 and 520, through the suitable setting of delay times td0~td5, column decoder activation signal CDE is activated after the completion of taking-in and decoding of column address following the start of reading operation and the preamplifier signal is activated after read data appears on a data line in response to the activation of column decoder activation signal CDE. On the other hand, for the inactivation of the column-related reading operation, column decoder activation signal CDE is inactivated following the inactivation of the preamplifier signal.

Here, delay times td0 and td3 added respectively by delay circuits 522 and 532 are set such that they are longer than time tdR, that is, a period from the rise of clock signal CLK to the activation of read command signal READ. The purpose is to prevent an activation period of a control signal generated in response to a rising edge of a clock signal at the command generation from being shortened than that of a signal generated in response to other rising edge of the clock signal.

As shown in FIGS. 15 and 16, the delay circuits for the timing adjustment have generally been arranged independently for internal control signals of different types in the conventional control signal generation circuit. As a result, however, the increase in the number of types of internal control signals directly leads to increase in the number of delay circuits hence to the increase in layout area. The reduction of layout are is crucial today as the reduction in size of devices to which semiconductor device is incorporated is being advanced.

SUMMARY OF THE INVENTION

An object of the present invention is to reduce the layout area of the control signal generation circuit by sharing a delay circuit among a plurality of control signal generation circuits.

Another object of the present invention is to reduce the chip area of a semiconductor device by providing a plurality of control signal generation circuits sharing a delay circuit.

The present invention is, in brief, a control signal generation circuit generating a plurality of first control signals according to a second control signal which serves as a reference and including a delay circuit and a plurality of signal generation circuits.

The delay circuit has a function of delaying the second control signal by a predetermined time period and includes a plurality of delay units connected in series and a plurality of taps taking out output signals from the plurality of delay units, respectively. The plurality of signal generation circuits generate the plurality of first control signals, respectively. Each of the plurality of signal generation circuits sets a signal level of corresponding one of the plurality of first control signals according to the signal levels of at least two of a plurality of delay signals supplied to the plurality of taps, respectively.

According to another aspect, the present invention is a semiconductor device including a control signal generation circuit.

The control signal generation circuit generates a plurality of internal control signals for carrying out a series of predetermined operations in the semiconductor device according to a control signal which serves as a reference and includes a delay circuit for delaying the control signal as a reference by a predetermined time period. The delay circuit includes a plurality of delay units connected in series and a plurality of taps for taking out output signals of the plurality of delay units, respectively.

The control signal generation circuit further includes a plurality of signal generation circuits for supplying a plurality of internal control signals, respectively. Each of the plurality of signal generation circuits sets a signal level of corresponding one of the plurality of control signals according to the signal levels of at least two of the plurality of delay signals supplied as outputs to the plurality of taps, respectively.

According to still another aspect, the present invention is a control signal generation circuit generating a plurality of first control signals based on a second control signal having a first state and a second state, and the control signal generation circuit includes a first delay circuit, a second delay circuit, and a plurality of signal generation circuits.

The first delay circuit is responsive to a first transition of the second control signal from the first state to the second state to output a plurality of first delay signals. A signal level of each of the plurality of first delay signals is changed a delay time after the first transition. The delay time is different from signal to signal. The second delay circuit is responsive to a second transition of the second control signal from the second state to the first state to output a plurality of second delay signals. A signal level of each of the plurality of second delay signals is changed a delay time after the second transition. The delay time is different from signal to signal.

The plurality of signal generation circuits generate the plurality of first control signals, respectively. Each of the signal generation circuits sets a signal level of a corresponding one of the plurality of first control signals in response to change in signal levels of the plurality of first delay signals and the plurality of second delay signals.

According to still another aspect, the present invention is a semiconductor device including a control signal generation circuit.

The control signal generation circuit is responsive to a reference control signal having a first state and a second state to generate a plurality of internal control signals for performing a series of predetermined operations in the semiconductor device. The control signal generation circuit includes a first delay circuit responsive to a first transition of the reference control signal from the first state to the second state to output a plurality of first delay signals. A signal level of each of the plurality of first delay signals is changed a delay time after the first transition. The delay time is different from signal to signal. The control signal generation circuit further includes a second delay circuit responsive to a second transition of the reference control signal from the second state to the first state to output a plurality of second delay signals. A signal level of each of the plurality of second delay signals is changed a delay time after the second transition. The delay time is different from signal to signal. The control signal generation circuit further includes a plurality of signal generation circuits to generate the plurality of internal control signals, respectively. Each of the signal generation circuits sets a signal level of a corresponding one of the plurality of internal control signals in response to change in signal levels of the plurality of first delay signals and the plurality of second delay signals.

Thus, a main advantage of the present invention lies in that as the plurality of second control signals can be generated based on the first control signal which is delayed by the predetermined time period by the delay circuit shared among signal generation circuits, the layout area of the control signal generation circuit generating the plurality of internal control signals at a predetermined timing according to the same control signal can be reduced.

In addition, the layout area of the semiconductor device can be reduced as the internal control signal controlling the operation of the semiconductor device is generated by the control signal generation circuit capable of generating the internal control signal according to the reference control signal which is delayed by a predetermined time period by the delay circuit shared among the signal generation circuits.

Further, the plurality of first control signals which are generated in response to rise and fall of the second control signal serving as a reference can be generated through the common delay circuit without increase in layout area of the control signal generation circuit and hence, the semiconductor device. Still further, the timing accuracy of the first control signal can be improved because the delay circuit is shared and the device becomes less susceptible to the effect of variation in delay time caused by the difference in layout.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
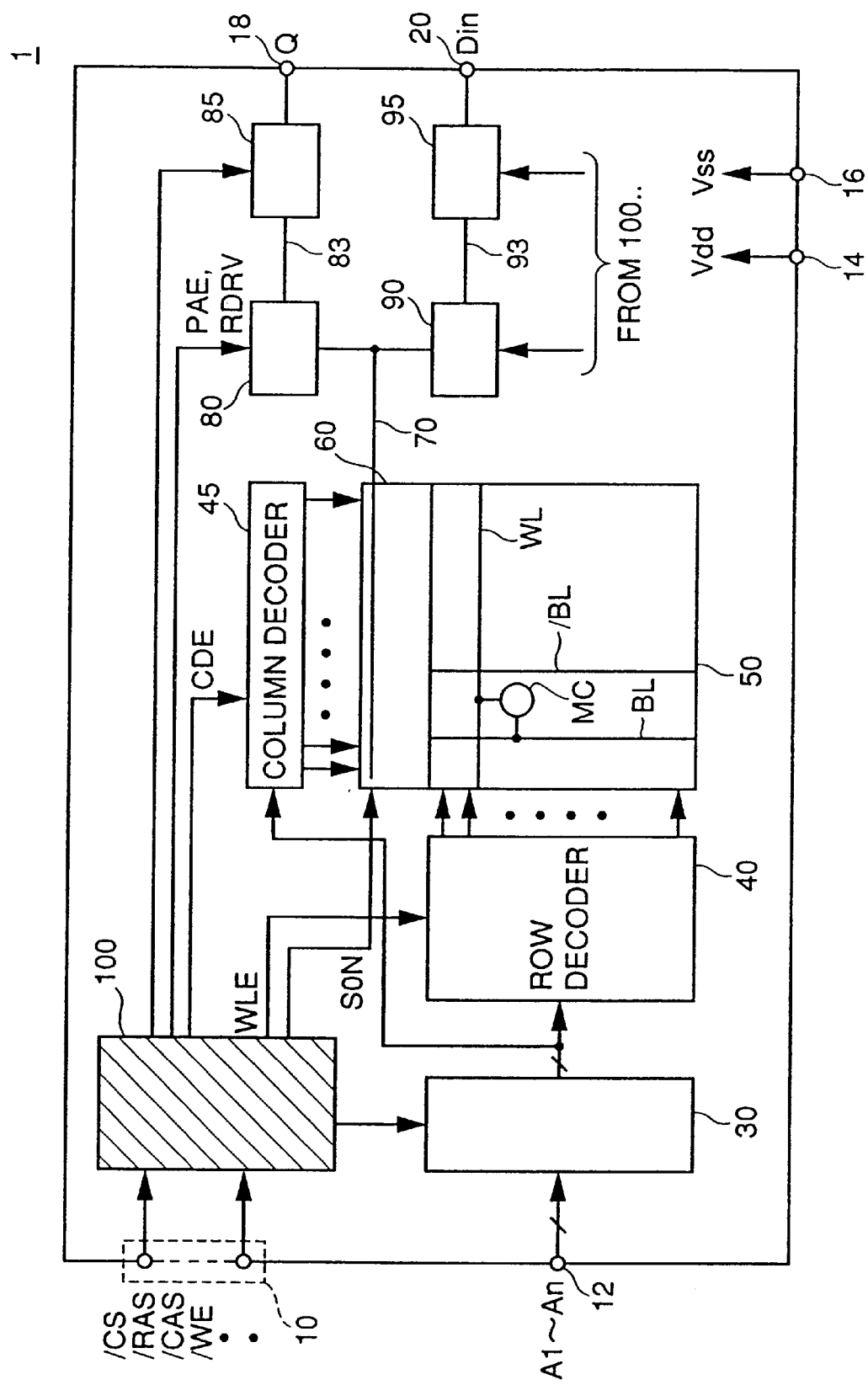
FIG. 1 is a block diagram showing a structure of a semiconductor device 1 including a control signal generation circuit according to the first embodiment of the present invention.

The embodiments of the present invention will be described in detail below with reference to the drawings. In the drawings, the same reference character denotes the same or corresponding portion.

First Embodiment

In FIG. 1, a DRAM (Dynamic Random Access Memory) is shown as an example of the semiconductor devices.

With reference to FIG. 1, a semiconductor device 1 includes command control signal input terminals 10 receiving command control signals /RAS, /CAS, /WE and /CS from an external source, an address terminal 12 receiving each of bits A1~An of an address signal, power supply terminals 14 and 16 for receiving power supply voltage Vdd and ground voltage Vss, respectively, a data output terminal 18 for supplying read data as an output and a data input terminal 20 for receiving write data as an input.

Semiconductor device 1 further includes a control signal generation circuit 100 receiving command control signals supplied as inputs to command control signal input terminals 10 and supplying a plurality of internal control signals controlling an internal operation of semiconductor device 1 as outputs and a memory cell array 50 having a plurality of memory cells arranged as a matrix. Memory cell array 50 has a word line and a bit line arranged for each of rows and columns of the memory cell. In FIG. 1, an arrangement of word line WL and bit line pair BL and /BL corresponding to one memory cell MC is shown as an example.

Semiconductor device 1 further includes an address buffer 30 receiving each bit of the address signal from address input terminal 12, a row decoder 40 and a column decoder 45 for selecting a row and a column of a memory cell, respectively, according to an internal address supplied from address buffer 30 and a sense amplifier circuit 60 for reading out a data signal on a bit line corresponding to a row selected by column decoder 45.

Semiconductor device 1 further includes a preamplifier circuit 80 for amplifying data read out by sense amplifier circuit 60, a read data bus 83 transmitting the data amplified by preamplifier circuit 80, an output buffer 85 transmitting data on read data bus 83 to data output terminal 18, an input buffer 95 receiving data input to data input terminal 20, a write data bus 93 for transmitting data input to input buffer 95 and a write driver 90 for writing data transmitted on write data bus 93 to the memory cell array. An I/O line 70 couples preamplifier 80 and write driver 90 with sense amplifier circuit 60.

Control signal generation circuit 100 generates the plurality of internal control signals for controlling various internal operations such as a row-related operation, a column-related reading operation, a data input/output operation and so on according to the command control signals supplied to command control signal input terminals 10. In the following description, the column-related operation at the generation of the read command will be described as a representative example.

Control signal generation circuit 100 supplies a column decoder activation signal CDE designating a start of decoding of a column address to column decoder 45, a preamplifier activation signal PAE designating an activation of an amplification operation of preamplifier circuit 80 and a read driver control signal RDRV activating a read driver (not shown) included in preamplifier circuit 80 for transmitting the amplified data signal to read data bus 83. The activation/inactivation of these internal control signals at appropriate timings realizes the correct operation of a series of column-related reading operations.

Control signal generation circuit 100 further outputs a word line activation signal WLE indicating an activation timing of a word line WL to row decoder 40, and a sense amplifier activation signal S0N indicating an activation timing of a sense amplifier in sense amplifier circuit 60. Through the activation/inactivation of these internal control signals at an appropriate timing, a series of row-related operations are properly performed.

Figure 2:
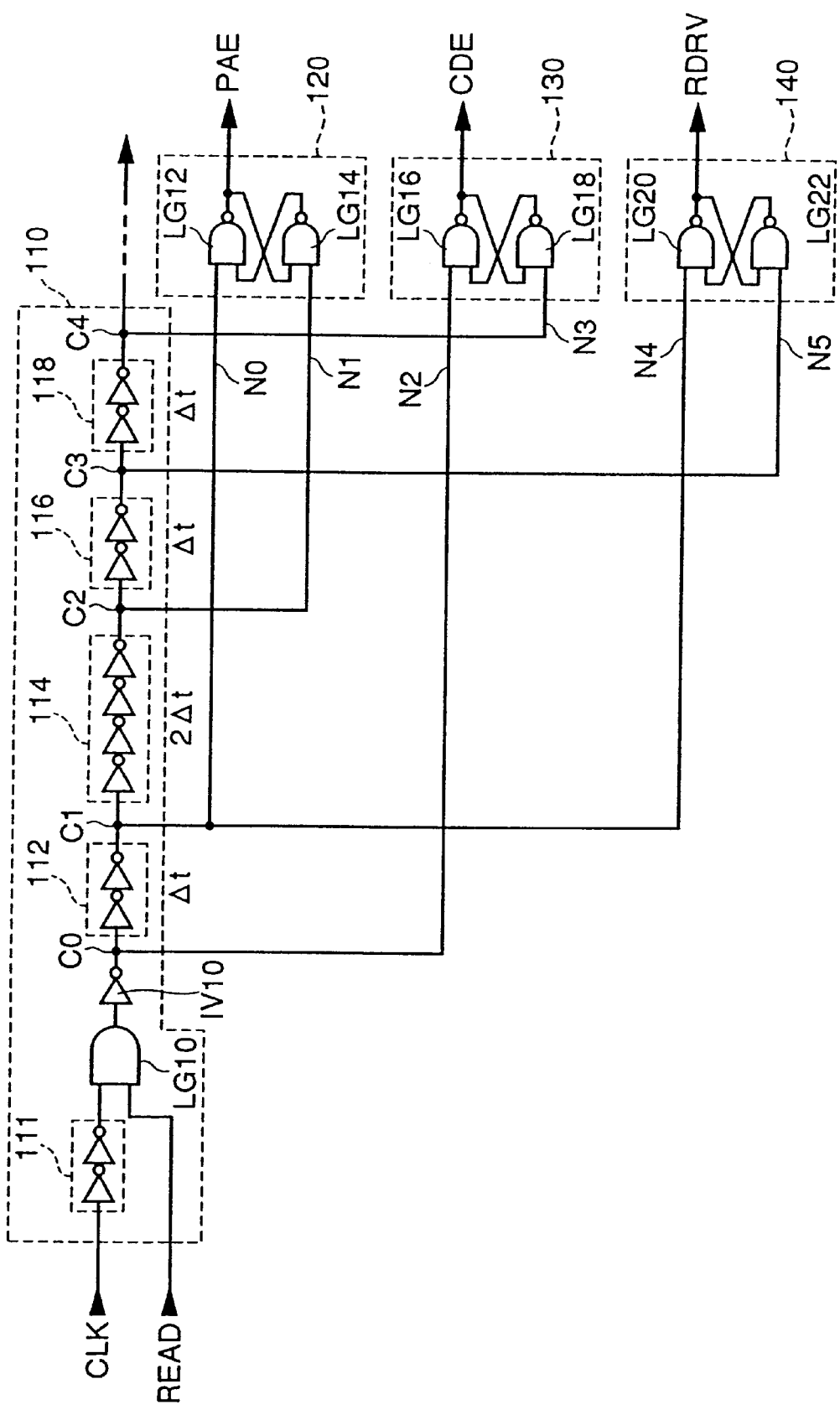
FIG. 2 is a circuit diagram showing a portion relating to the column-related reading operation in a control signal generation circuit 100 according to the first embodiment.

With reference to FIG. 2, control signal generation circuit 100 includes a preamplifier control circuit 120 supplying preamplifier activation signal PAE as an output, a column decoder control circuit 130 supplying column decoder activation signal CDE as an output, a read driver control circuit 140 supplying read driver control signal RDRV as an output and a common delay circuit 110 shared by control circuits 120, 130 and 140 mentioned above. In the following, preamplifier control circuit 120, column decoder control circuit 130 and read driver control circuit 140 will be collectively denoted as control circuits 120~140 as required.

Figure 9:
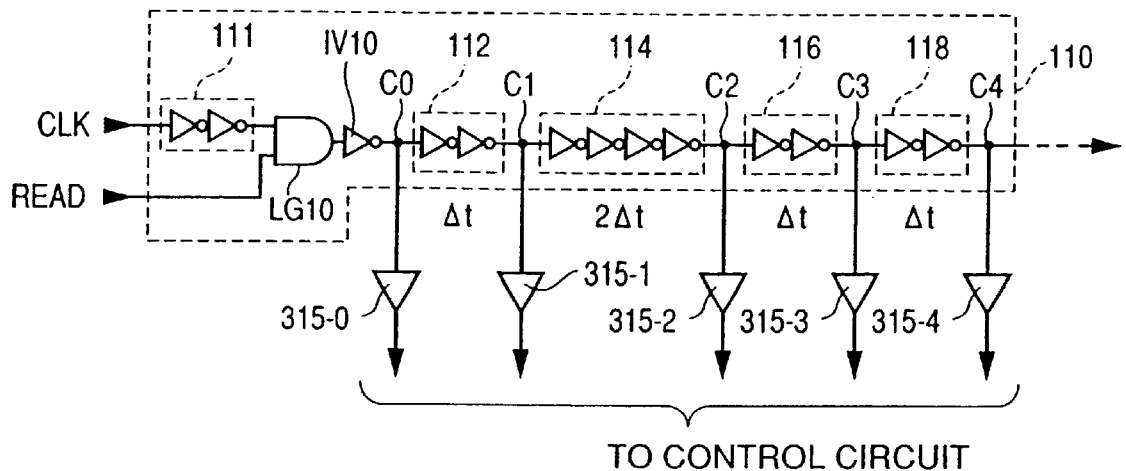
FIG. 9 is a circuit diagram showing a structure of a common delay circuit 310 provided in a control signal generation circuit according to the fourth embodiment of the present invention.

Here, though not shown in the drawing, control signal generation circuit 100 is considered to have a similar circuit to control signal generation circuit 510 generating read command signal READ as shown in FIG. 9.

Common delay circuit 110 includes a delay circuit 111 delaying clock signal CLK, a logic gate LG10 supplying the result of an AND operation according to the output of delay circuit 111 and read command signal READ, an inverter IV10 inverting the output of logic gate LG10 and supplying the resulting signal to a node C0 and delay circuits 112, 114, 116 and 118 connected in series and provided for delaying the control signal supplied to node C0. Terminals are arranged as taps for node C0 and output nodes C1~C4 of delay circuits 112, 114, 116 and 118, and delay signals supplied from delay circuits, respectively, can be taken out therefrom. In the following, nodes C0~C4 are denoted as taps as well.

In FIG. 2, though a portion up to delay circuit 118 and tap C4 is shown for the convenience of the illustration, an additional delay circuit can be connected in series in a further stage.

With such structure, a signal of an opposite polarity to clock signal CLK and having a delayed timing will be supplied to each of taps C0~C4 where terminals are provided.

Each of control circuits 120~140 includes a flip flop operating in response to a signal taken out from a corresponding tap.

Preamplifier control circuit 120 includes an NAND gates LG 12 and LG14 constituting an S-R flip flop receiving a signal from tap C1 as a set input (input node N0) and a signal from tap C2 as a reset input (input node N1). Preamplifier control circuit 120 activates preamplifier activation signal PAE (to an H level) at the timing of the transition of the signal from tap C1 to an L level and inactivates preamplifier activation signal PAE (to an L level) at the timing of the transition of the level of the signal from tap C2 to an L level.

Similarly, column decoder control circuit 130 includes NAND gates LG16 and LG18 constituting an S-R flip flop receiving a signal from tap C0 as a set input (input node N2) and a signal from tap C4 as a reset input (input node N3). Column decoder control circuit 130 activates column decoder activation signal CDE (to an H level) at the timing of the transition of the signal from tap C0 to an L level and inactivates column decoder activation signal CDE (to an L level) at the timing of the transition of the level of the signal from tap C4 to an L level.

Similarly, read driver control circuit 140 includes NAND gates LG20 and LG22 constituting an S-R flip flop receiving a signal from tap C1 as a set input (input node N4) and a signal from tap C3 as a reset input (input node N5). Read driver control circuit 140 activates read driver control signal RDRV (to an H level) at the timing of the transition of the signal from tap C1 to an L level and inactivates read driver control signal RDRV (to an L level) at the timing of the transition of the level of the signal from tap C3 to an L level.

Thus it is possible to provide a common delay circuit shared by a plurality of control circuits for generating a series of internal control signals which are to be activated/inactivated after the elapse of a certain time period in response to the transition of a signal level of the same control signal which serves as a reference.

Common delay circuit 110 sequentially delays the reference control signal by the plurality of delay circuits connected in series and includes terminals as taps for supplying output signals of respective delay circuits. Thus, the timing adjustment of the activation/inactivation of each internal control signal can be relatively easily performed by altering the connection between the terminals provided for respective taps and the input nodes of the control circuits.

With common delay circuit 110 of the structure as described above, the increase in the number of the series of internal control signals to be generated according to the same reference control signal will not cause the increase in the number of delay circuits as the delay circuit is shared, hence the layout area will not increase.

Figure 3:
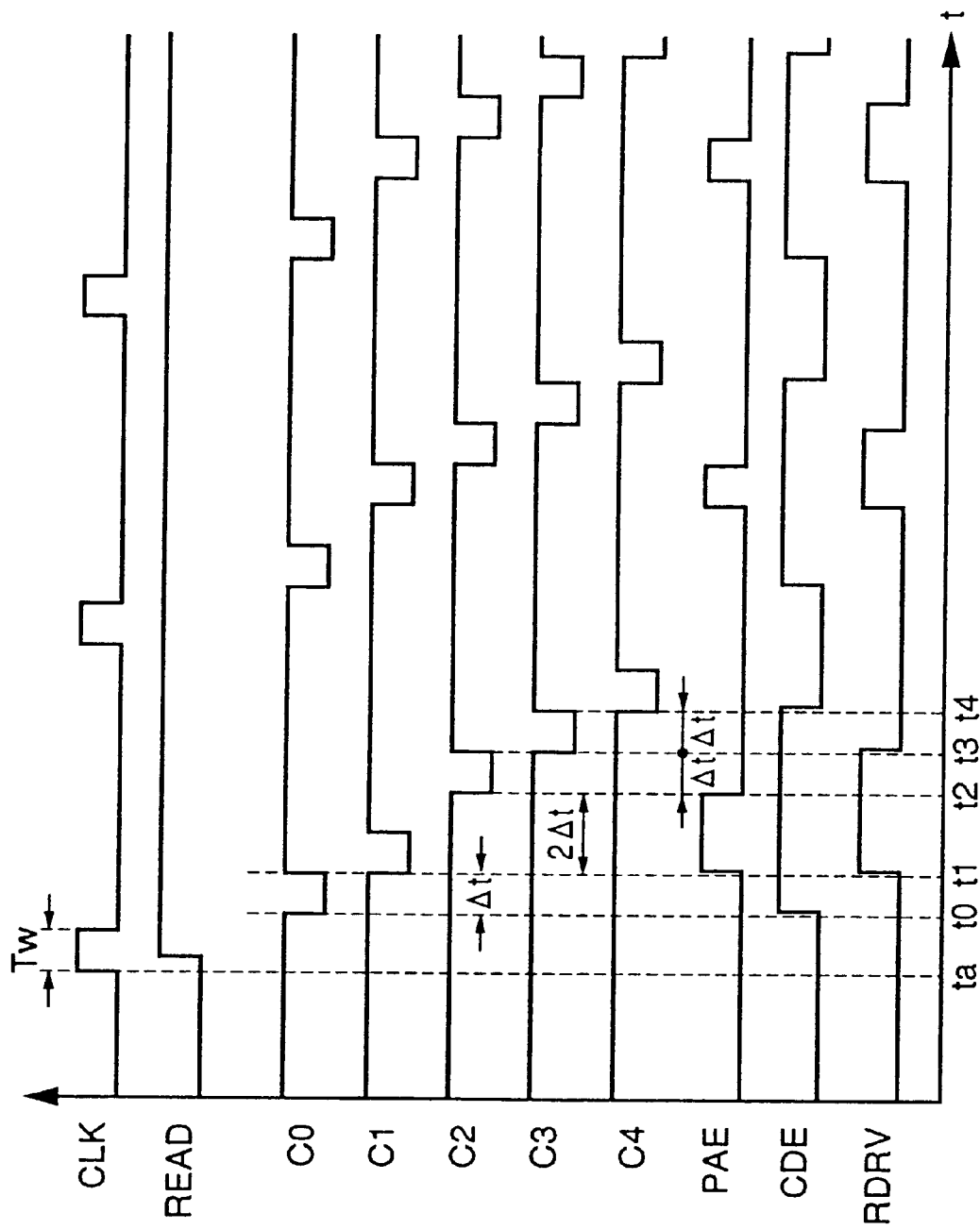
FIG. 3 is a timing chart referenced for describing an operation of a control signal generation circuit according to the first embodiment.

With reference to FIG. 3, at time ta, clock signal CLK rises and the read command is taken in. Then, in response, read command signal READ is activated (to an H level).

Signals each generated by inverting and delaying clock signal CLK are supplied as inputs to taps C0~C4. First, the signal level of tap C0 is turned to an L level at time t0, that is, after an elapse of delay period added by delay circuit 111 and inverter IV10 from time ta. The signal level of tap C0 returns to an H level after the elapse of activation period Tw of clock signal CLK.

The signal level of tap C1 attains an L level at time t1, that is, a delay time Δt added by delay circuit 112 after the time t0, and returns to an H level after the elapse of time Tw.

The signal level of tap C2 attains an L level at time t2, that is, a delay time 2·Δt added by delay circuit 114 after time t1 and returns to an H level after the elapse of time Tw from time t2.

Similarly, the signal level of tap C3 attains an L level at time t3, that is, delay time Δt added by delay circuit 116 after time t2 and returns to an H level after the elapse of time Tw. The signal level of tap C4 attains an L level at time t4, that is, delay time Δt added by delay circuit 118 after time t3 and returns to an H level after the elapse of time Tw.

Thus, preamplifier activation signal PAE is set to an H level, that is, activated in response to the transition of the level of the signal of tap C1 to an L level and is reset to an L level, that is, inactivated in response to the transition of the level of the signal of tap C2 to an L level.

Similarly, column decoder activation signal CDE is activated in response to the transition of the level of the signal of tap C0 to an L level and inactivated in response to the transition of the level of the signal of tap C4 to an L level. Read driver control signal RDRV is activated in response to the transition of the level of the signal of tap C1 to an L level and inactivated in response to the transition of the level of the signal of tap C3 to an L level.

Thereafter, the signal levels of the output signals of each tap and each internal control signal are set at the timing as described above in response to the rising and falling edges of clock signal CLK while read command signal READ is in an active state.

Modification of First Embodiment

In the modification of the first embodiment, another structure of a control circuit supplying a control signal as an output according to a signal level of a tap will be described.

Figure 4:
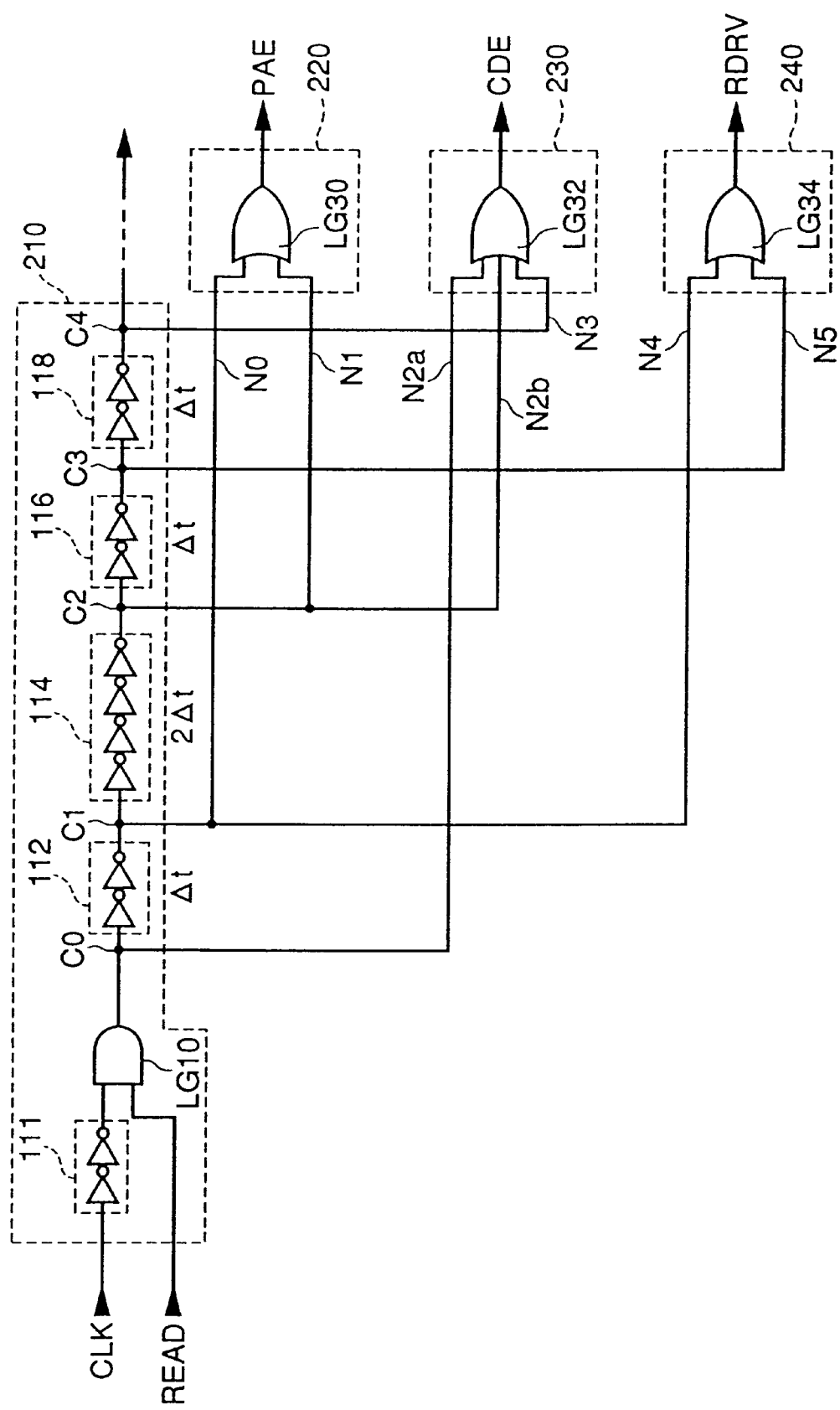
FIG. 4 is a circuit diagram showing a portion relating to the column-related reading operation in a control signal generation circuit according to a modification of the first embodiment.

With reference to FIG. 4, a control signal generation circuit according to the modification of the first embodiment includes a common delay circuit 210, a preamplifier control circuit 220, a column decoder control circuit 230 and a read driver control circuit 240.

Common delay circuit 210 is different from common delay circuit 110 shown in FIG. 2 in that it does not includes inverter IV10 between logic gate LG10 and tap C0. In other points, common delay circuit 210 is similar to common delay circuit 110 and the description thereof will not be repeated.

With such structure, common delay circuit 210 supplies delayed signals from clock signal CLK to taps C0~C4, respectively.

Preamplifier control circuit 220 includes a logic gate LG30 receiving output signals from taps C1 and C2 connected to input nodes N0 and N1, respectively, as two inputs and supplying the result of the OR operation as preamplifier activation signal PAE as an output.

Column decoder control circuit 230 includes a logic gate LG32 receiving output signals from taps C0, C2 and C4 connected to input nodes N2a, N2b and N3, respectively, as inputs and supplying the result of the OR operation thereof as column decoder activation signal CDE as an output.

Read driver control circuit 240 includes a logic gate LG34 receiving output signals from taps C1 and C3 connected to input nodes N4 and N5, respectively, as two inputs and supplying the result of the OR operation thereof as read driver control signal RDRV as an output.

Figure 5:
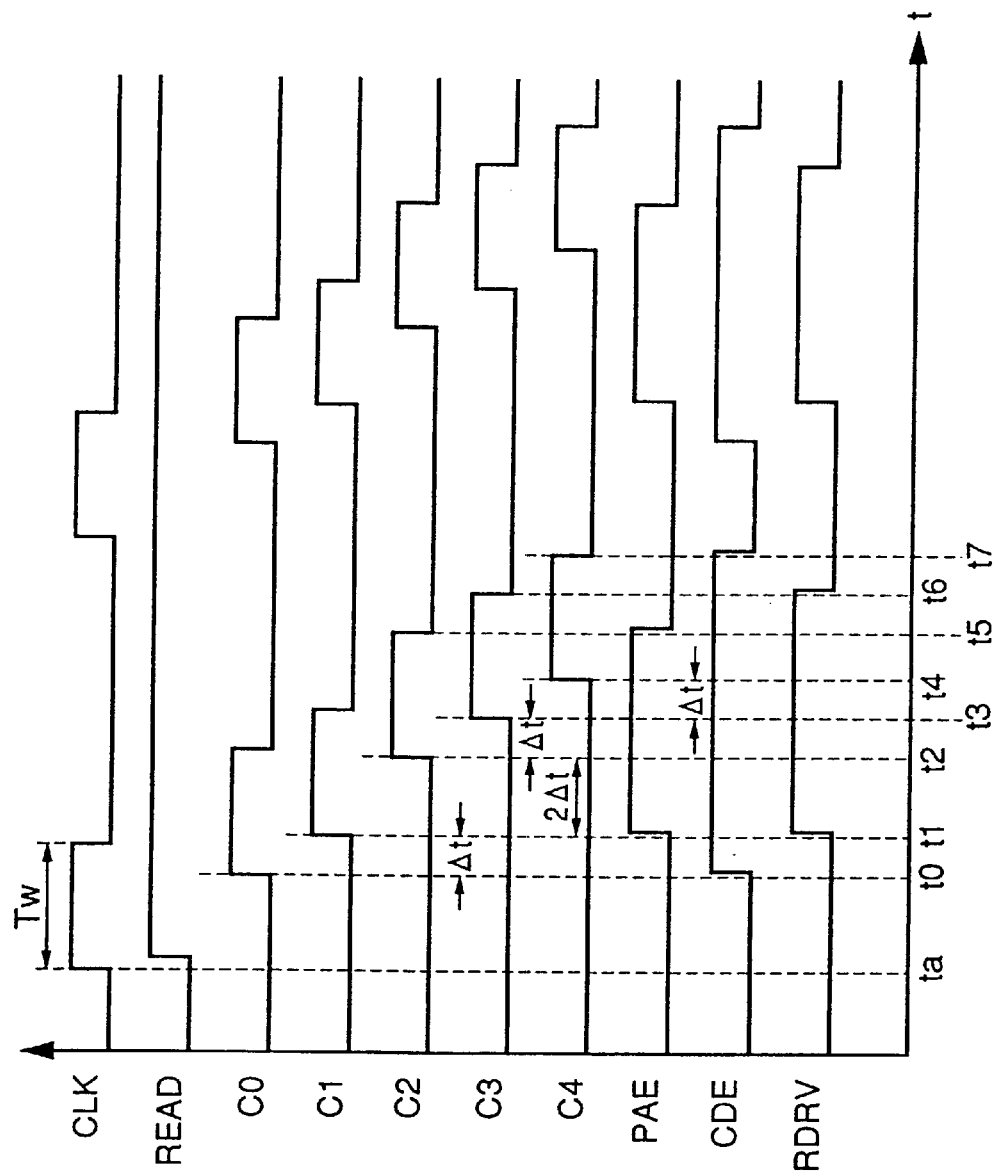
FIG. 5 is a timing chart referenced for describing an operation of a control signal generation circuit according to a modification of the first embodiment.

With reference to FIG. 5, at time ta clock signal CLK rises and the read command is taken in. Then in response thereto, read command signal READ is activated (to an H level).

At time t0, that is, a delay time added by delay circuit 111 and logic gate LG10 elapsed from time ta, the level of the signal of tap C0 rises to an H level and the active state is maintained during the activation period Tw of clock signal CLK.

At t1, that is, delay time Δt added by delay circuit 112 after time t0, the level of the signal of tap C1 rises to an H level and returns to an L level after the elapse of time Tw.

The level of the signal of tap C2 rises to an H level at time t2, that is, delay time 2·Δt added by delay circuit 114 after time t1 and attains an L level at time t5 after the elapse of time Tw.

Similarly, the signal levels of taps C3 and C4 rise to an H level at time t3 and t4, and attain an L level at time t6 and t7 after the elapse of time Tw. Time t3 is a point where delay time Δt added by delay circuit 116 is elapsed after time t2 and time t4 is a point where delay time Δt added by delay circuit 118 is elapsed after time t3. In FIG. 5, provided that a delay time of a unit delay circuit formed of two inverters is Δt, in this example, Tw>2·Δt.

With such structure, it is possible to supply as an output a control signal which is activated in response to the rise of a signal taken out from one tap of the common delay circuit and inactivated in response to the fall of a signal taken out from another tap of the common delay circuit.

Preamplifier activation signal PAE is activated (to an H level) in response to the transition of the level of the signal of tap C1 to an H level and is inactivated (to an L level) in response to the transition of the level of the signal of tap C2 back to an L level.

Similarly, column decoder activation signal CDE is activated (to an H level) in response to the transition of the level of the signal of tap C0 to an H level and inactivated (to an L level) in response to the transition of the level of the signal of tap C4 back to an L level. Read driver control signal RDRV is activated (to an H level) in response to the transition of the level of the signal of tap C1 to an H level and inactivated (to an L level) in response to the transition of the level of the signal of tap C3 back to an L level.

Here, it must be noted that when the internal control signal is to be activated for a long time period in the circuit shown in FIG. 4, in addition to an output of a tap determining the rise and an output of a tap determining the fall, an output of a tap located therebetween must be supplied to the OR gate.

In logic gate LG32 supplying column decoder activation signal CDE as an output, for example, in addition to the output of tap C0 for determining the timing of activation and the output of tap C4 for determining the timing of inactivation, the output of tap C2 located therebetween is supplied as an input. This is because an intermediate signal for maintaining the active state of column decoder activation signal CDE is necessary as the phase difference between the signal levels of taps C0 and C4 is longer than activation period Tw of clock signal CLK.

Thus, employing a signal supplied from the common delay circuit, generated by delaying the clock signal, the output of internal control signals at various timings is allowed. With such structure, the delay circuit can be shared among a plurality of control circuits for generating a series of internal control signals to be activated/inactivated after the elapse of a predetermined time period in response to the transition of the signal level of the same reference control signal. Hence, even when the number of the series of internal control signals to be generated according to the reference control signal is increased, the increase in layout area will not be caused from the increase in the number of delay elements, as the delay circuit is shared.

In the first embodiment and the modification thereof, the control signal generation circuit generating the internal control signals relating to the column-related reading operation of the DRAM which is shown as an example of the semiconductor devices is described. The application of the present invention is not limited solely to such a case.

In other words, the control signal generation circuit according to the first embodiment and the modification thereof of the present invention can be applied for the generation of other control signals for controlling the row-related operation and a writing operation in the semiconductor devices. In addition, the structure where the delay signal is taken out from the common delay circuit at various timings through the plurality of taps can be widely applied to a structure where the output of a series of control signals is necessary at a timing which is adjusted with respect to the reference signal as required, and not limited to the application for the control circuit in the semiconductor device.

In addition, with regards to the first embodiment and the modification thereof, the structure for generating the internal control signals through the flip flop circuit and the OR gate according to the output signal from each tap of the common delay circuit is described. These circuit structures are, however, mere examples and various combinations of logic circuits allowing the activation and inactivation of the internal control signals in response to the transition in the signal level of the output signal from each tap of the common delay circuit can be applied as well.

Second Embodiment

In the second embodiment and the third embodiment, an efficient arrangement will be described for forming a portion relating to the column-related reading operation in the control signal generation circuit described with respect to the first embodiment on a semiconductor substrate.

Figure 6:
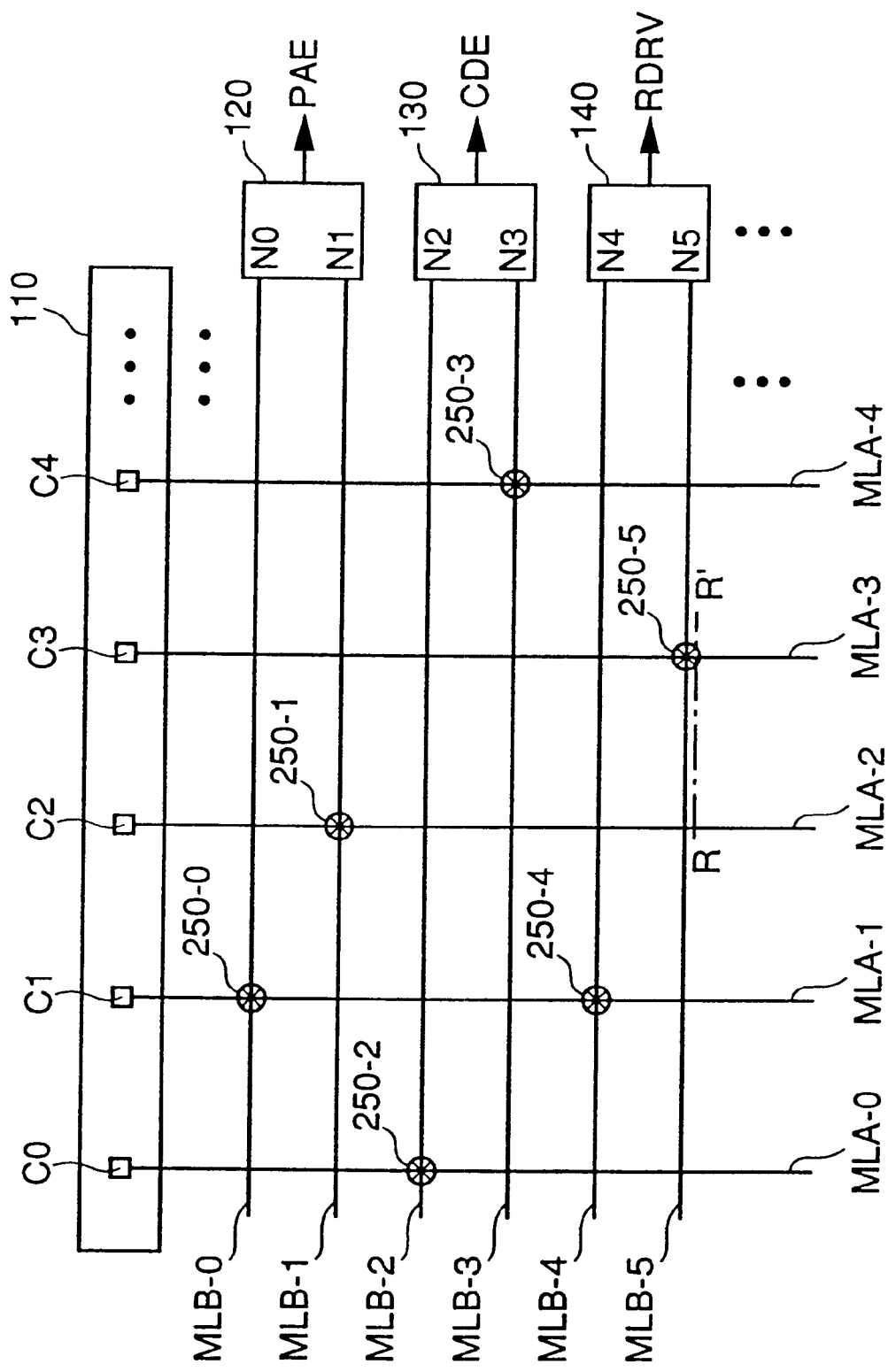
FIG. 6 is a conceptual diagram referenced for describing a structure of a portion related to the column-related reading operation in a control signal generation circuit according to the second embodiment.

With reference to FIG. 6, the control signal generation circuit according to the second embodiment includes a common delay circuit 110, a preamplifier control circuit 120, a column decoder control circuit 130 and a read driver control circuit 140. The structure of common delay circuit 110 is the same with that described with reference to FIG. 2 and the delay signal is taken from terminals provided for taps C0~C4. As the structures and operations of control circuits 120~140 are similar to that of the first embodiment, the description thereof will not be repeated.

In the control signal generation circuit according to the second embodiment, lines MLA-0~MLA-4 connected to terminals provided for taps C0~C4, respectively and lines MLB-0~MLB-5 connected to input nodes N0~N5 of control circuits 120~140, respectively are provided.

Lines MLA-0~MLA-4 and MLB-0~MLB-5 are two-layered lines provided on the semiconductor substrate. Lines MLA-0~MLA-4, for example, are first metal lines for taking out the output signals of taps C0~C4 of the common delay circuit and lines MLB-0~MLB-5 are second metal lines provided as a second layer in a direction perpendicular to the first metal lines.

With respect to preamplifier control circuit 120, lines MLB-0 and MLB-1 are connected to lines MLA-1 and MLA-2, respectively. Similarly, with respect to column decoder control circuit 130, lines MLB-2 and MLB-3 are connected to lines MLA-0 and MLA-4, respectively. With respect to read driver control circuit 140, lines MLB-4 and MLB-5 are connected to lines MLA-1 and MLA-3, respectively.

By these connections, the output signal of each predetermined tap of the common delay circuit can be supplied to each of input nodes N0~N5 of control circuits 120~140, similarly to FIG. 2.

The connection between each line is realized through a via hole (through hole) formed in an interlayer insulation film at the cross point of lines to be connected.

Figure 7:
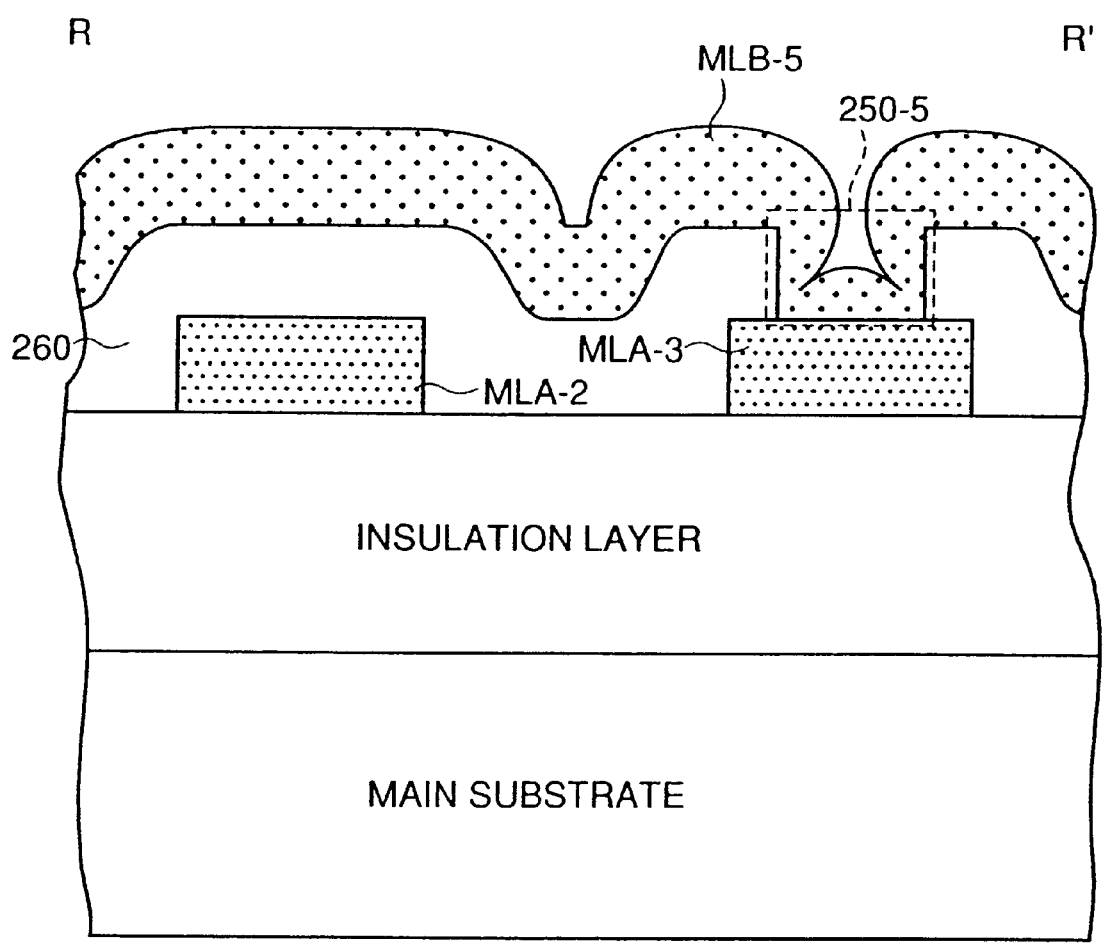
FIG. 7 is a sectional view on R–R' of FIG. 6.

FIG. 7 is a sectional view on R–R' of FIG. 6. With reference to FIG. 7, the first metal lines MLA-2 and MLA-3 and the second metal line MLB-5 are formed on an insulation layer formed on an upper surface of a main substrate. An interlayer insulation film 260 is formed between two wiring layers.

First metal line MLA-3 and second metal line MLB-5 are connected via a via hole 250-5 formed in interlayer insulation film 260. First metal line MLA-2 and second metal line MLB-5 are electrically isolated from each other as no via hole is formed therebetween.

With such structure in the control signal generation circuit according to the second embodiment, the timing of activation and inactivation of a internal control signal generated in each control circuit can be altered simply by changing a via hole arrangement.

For example, in preamplifier control circuit 120, lines MLA-1 and MLB-0 are connected via a via hole 250-0 and lines MIA-2 and MLB-1 are connected via a via hole 250-1. Similarly, in column decoder control circuit 130 and read driver control circuit 140, the same connections as in FIG. 2 are realized through via holes 250-2~250-5.

Thus, with the structure shown in FIG. 6, the control signal generation circuit can be efficiently formed on the semiconductor substrate sharing the output of common delay circuit 110 for the generation of the plurality of internal control signals and allowing easy adjustment of the timing of activation and inactivation of the internal control signals.

Third Embodiment

Figure 8:
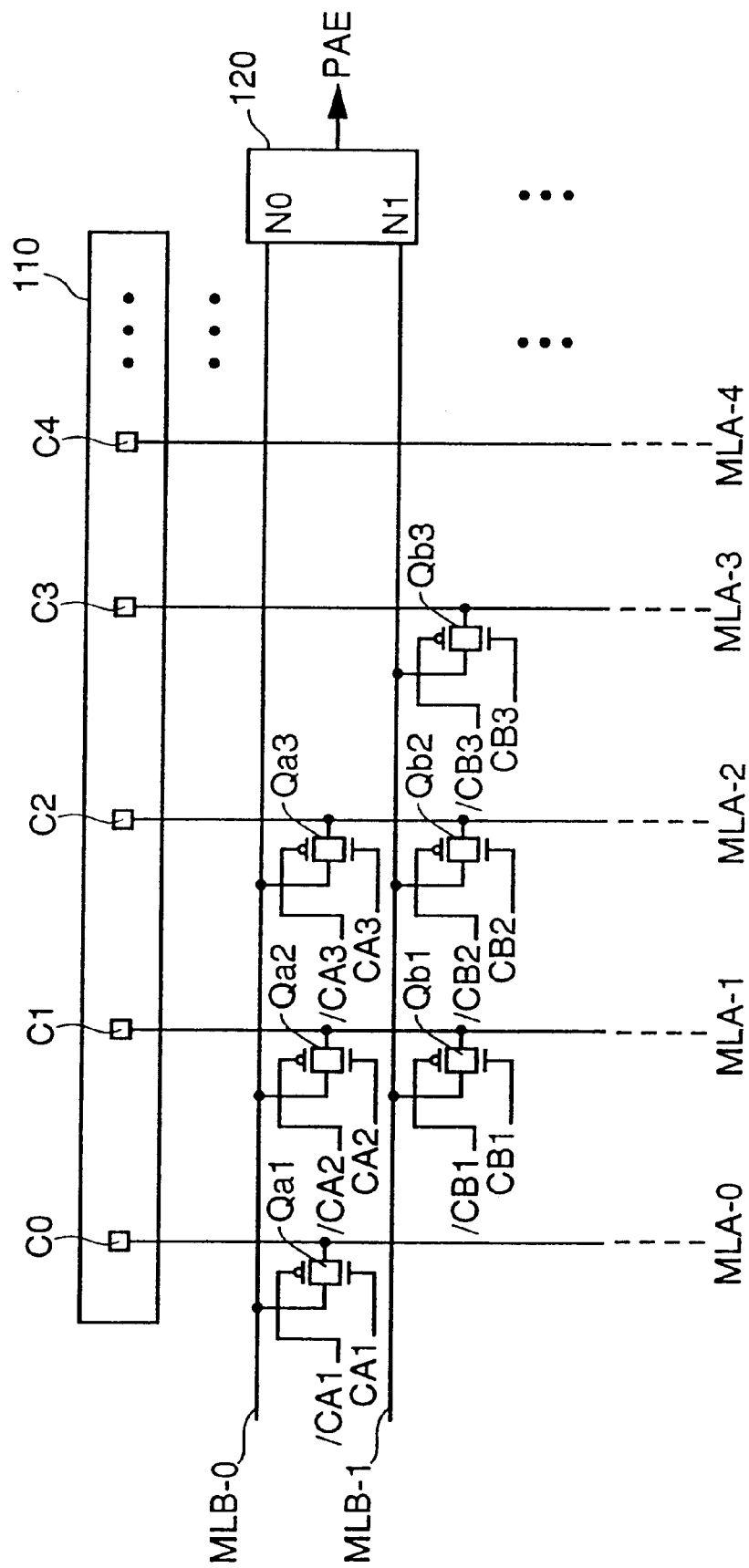
FIG. 8 is a conceptual diagram referenced for describing a structure of a portion relating to the column-related reading operation in a control signal generation circuit according to the third embodiment.

In FIG. 8, a connection between common delay circuit 110 and preamplifier control circuit 120 according to the third embodiment is shown as a representative.

With reference to FIG. 8, output signals of taps taken out from common delay circuit 110, respectively, are transmitted through lines MLA-0~MLA-4, respectively as in the second embodiment. Similar to the second embodiment, input nodes N0 and N1 of preamplifier control circuit 120 are connected to lines MLB-0 and MLB-1, respectively.

In the third embodiment, these lines are connected to each other via transistors rather than being directly connected through a via hole as described in connection with the second embodiment. Line MLB-0, for example, is electrically connected to lines MLA-0~MLA-2 through CMOS switches Qa1~Qa3, respectively.

To the gates of CMOS switches Qa1~Qa3, control signals CA1, /CA1, CA2, /CA2, CA3, /CA3 are supplied from control circuit 100 and one of these CMOS switches is selectively turned on.

Similar to the embodiments described above, to supply a timing signal as an output signal from tap C1 for activating preamplifier control signal PAE, first, control signals CA2 and /CA2 are turned to an H level and an L level, respectively, and then the other control signals CA1 and CA3 are turned to an L level and /CA1 and /CA3 are turned to an H level. Then, the output signal of tap C1 can be supplied to an input node N0 by selectively turning CMOS switch Qa2 on.

A feature of the circuit shown in FIG. 8 lies in that a tap connected to the input node of the control circuit can be switched through software implementation (that is, without causing change in the hardware) by changing the signal levels of control signals CA1, /CA1~CA3, /CA3, for example, by turning control signal CA1 or CA3 to an H level and turning the other control signals to an L level.

In other words, even when the output signal of tap C1 is initially programmed to be employed for setting the timing of activation of preamplifier control signal PAE, if inconvenience is found with respect to the timing, the activation timing of the preamplifier control signal can be made faster or slower by switching the CMOS switch to be turned on to Qa1 or Qa3. As the change can be carried out through software implementation, as far as the structure of control circuit 100 is so formed as to allow control signals to be switched in a test mode, for example, according to the input from an external source, the activation/inactivation timing of the internal control signal can be adjusted without the needs of additional device processing.

As to the inactivation timing of the preamplifier control signal, line MLB-1 can be connected to one of lines MLA-1~MLA-3, by selectively turning one of transistors Qb1~Qb3 on in the similar manner.

The same effect can be obtained in other control circuits not shown, as well, by arranging a CMOS switch between lines formed in a mesh-like manner, and supplying a control signal to the gate of each CMOS switch to selectively turn the transistor on.

The technique described with respect to second and third embodiments is applicable not only to the structure of the control circuit shown according to the first embodiment but to the structures of the control circuits employing other combinations of logic circuits including a structure employing the OR operation gate in the control circuit as shown in the modification of the first embodiment Fourth Embodiment A structure according to the fourth embodiment will be described in which timing accuracy of delay signals output from respective taps can be maintained, regardless of effect of each control circuit connected as a load to the tap of the common delay circuit.

With reference to FIG. 9, a common delay circuit 310, provided in a control signal generation circuit according to the fourth embodiment of the present invention, further includes signal drivers 315-0, 315-1, 315-2, 315-3, 315-4, . . . , provided corresponding to taps C0, C1, C2, C3, C4, . . . , supplying delay signals, in addition to the structure of common delay circuit 110 receiving clock signal CLK and read command signal READ as inputs as shown in FIG. 2. Each signal driver drives a signal supplied from its corresponding tap and transmits the signal to the input node of the control circuit.

The outputs of signal drivers 315-0~315-4 are shared by a plurality of control circuits as described with regard to first and second embodiments.

Each of signal drivers 315-0~315-4 is constituted from even inverters connected in series, for example. When the structures of all signal drivers are same, a high timing accuracy of delay signals which are taken out from respective taps can be maintained.

When an output signal from a particular tap is intensively used by a plurality of control circuits, the output signal of this tap may deform and the rising time and the falling time of the signal may become longer to degrade the timing accuracy. If the signal driver is provided corresponding to each tap, as described above, a high timing accuracy of the delay signal output from each tap can be maintained regardless of the arrangement and structure of a control circuit connected in a subsequent stage as a load.

Figure 10:
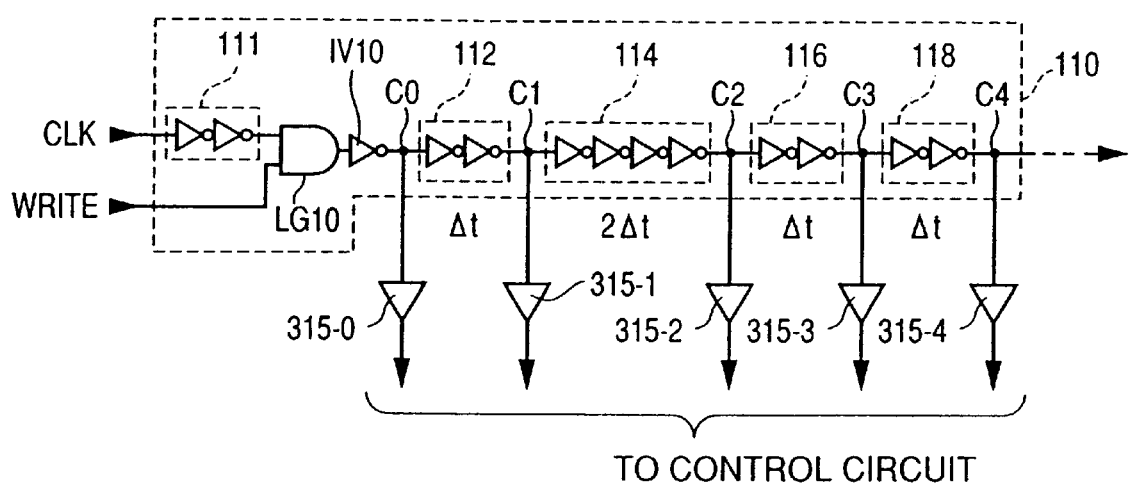
FIG. 10 is a diagram showing another example of a structure of a common delay circuit according to the fourth embodiment.

FIG. 10 is a diagram showing another example of the structure of the common delay circuit according to the fourth embodiment.

In FIG. 10, write command signal WRITE is supplied to common delay circuit 310 as an input instead of read command signal READ.

The common delay circuit supplying a delay signal corresponding to read command signal READ as shown in FIG. 9 cannot be used for a control circuit other than the control circuit for a control signal relating to the column-related reading operation, for example. When the common delay circuit outputs a delay signal based on write command signal WRITE, which is a fundamental control signal, the output of the common delay circuit can be used also for a control circuit controlling a column-related writing operation. Thus, the range of control circuits sharing the common delay circuit can be widened.

Fifth Embodiment

In the fifth embodiment, a structure will be described of a common delay circuit shared by a plurality of control circuits for generating, in response to rise and fall of a single control signal, a series of internal control signals to be activated/inactivated after an elapse of a predetermined time period.

Figure 11:
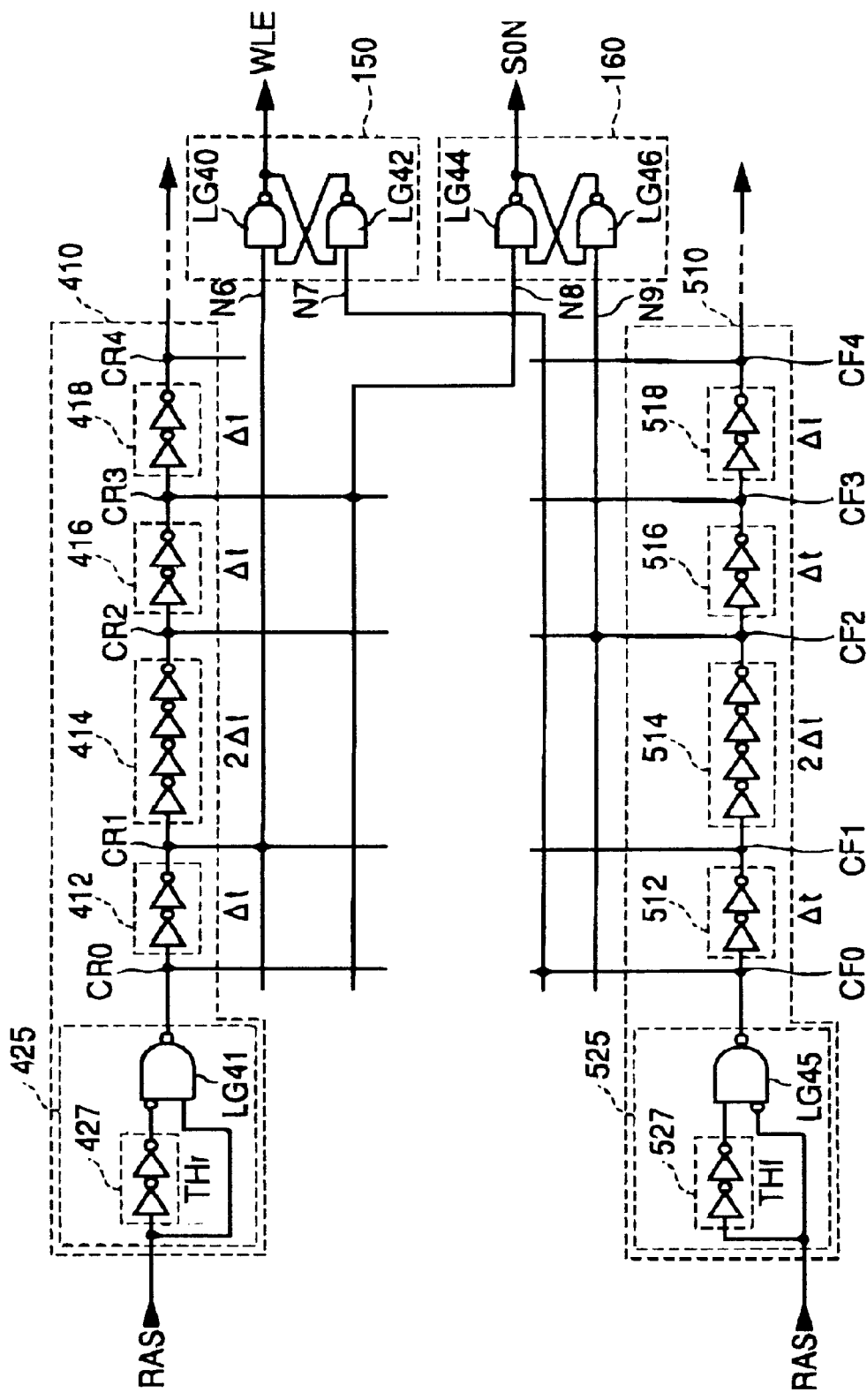
FIG. 11 is a circuit diagram showing a portion relating to a row-related operation in a control signal generation circuit according to the fifth embodiment.

In FIG. 11, a portion relating to a row-related operation in the control signal generation circuit according to the fifth embodiment is shown.

With reference to FIG. 11, the control signal generation circuit according to the fifth embodiment includes common delay circuits 410 and 510, a word line control circuit 150 supplying a word line activation signal WLE and a sense amplifier control circuit 160 supplying a sense amplifier activation signal SON. Hereinbelow, word line control circuit 150 and sense amplifier control circuit 160 will collectively be referred to as a control circuit, if necessary.

Common delay circuit 410 outputs a plurality of delay signals based on rise of control signal RAS. Common delay circuit 410 includes a pulse generation circuit 425 to output a one-shot pulse to a node CR0 in response to rise of control signal RAS and delay circuits 412, 414, 416 and 418 connected in series and provided for delaying the one-shot pulse supplied to node CR0.

A one-shot pulse generation circuit 425 includes a shift circuit 427 for delaying control signal RAS by a predetermined time period THr and a logical gate LG41 supplying the result of NAND logical operation of an inverted version of an output signal of shift circuit 427 and control signal RAS. Logical gate LG41 is responsive to rise of control signal RAS to generate a one-shot pulse with pulse width THr.

To output nodes CR1~CR4 of delay circuits 412, 414, 416 and 418 and node CR0, terminals are arranged as taps and delay signals supplied to respective nodes can be taken out. Hereinbelow, nodes CR0~CR4 will be also referred to as taps. With such structure, taps CR0~CR4 with terminals supply a plurality of delay signals activated (to an L level) after an elapse of predetermined delay time period which is different from signal to signal from rise of control signal RAS.

In FIG. 11, stages up to delay circuit 418 and tap CR4 in common delay circuit 410 are shown for convenience of description, though it is possible to connect another delay circuit in series in a subsequent stage.

A common delay circuit 510 has a similar structure to common delay circuit 410 and generates a plurality of delay signals based on the fall of control signal RAS.

Common delay circuit 510 includes a pulse generation circuit 525 responsive to fall of control signal RAS to output a one-shot pulse to node CF0 and delay circuits 512, 514, 516 and 518 connected in series and provided for delaying the one-shot pulse output to node CF0.

A one-shot pulse generation circuit 525 includes a shift circuit 527 for delaying control signal RAS by a predetermined time period THf, and a logical gate LG45 supplying the result of NAND logical operation of an output signal from shift circuit 527 and an invented version of control signal RAS. Logical gate LG45 is responsive to fall of control signal RAS to generate a one-shot pulse signal with a pulse width THf.

To output nodes CF1~CF4 of delay circuits 512, 514, 516 and 518 and node CF0, terminals are arranged as taps and delay signals supplied to respective nodes can be taken out. Hereinbelow, nodes CF0~CF4 are also referred to as taps. With such structure, taps CF0~CF4 with terminals output a plurality of delay signals activated (to an L level) after an elapse of a delay time which is different from signal to signal from the fall of control signal RAS.

In FIG. 11, the stages up to delay circuit 518 and tap CF4 in common delay circuit 510 are shown for convenience of description, although another delay circuit can be connected in series in a subsequent stage.

Control circuits 150 and 160 each include, as control circuits 120~140 described with reference to FIG. 2, a flip flop, which operates in response to a signal taken out from respective taps, though the detailed description thereof is not provided.

A word line control circuit 150 includes NAND gates LG40 and LG42 forming an S-R flip flop receiving a signal from tap CR1 as a set input (input node N6) and an output from tap CF0 as a reset input (input node N7). Similarly, sense amplifier control circuit 160 includes NAND gates LG44 and LG46 forming an S-R flip flop receiving a signal from tap CR3 as a set input (input node N8) and an output from tap CF2 as a reset input (input node N9).

In FIG. 11, the generation of word line activation signal WLE for controlling activation timing of word lines and sense amplifier activation signal S0N for controlling activation timing of sense amplifiers are described as a representative of the row-related operation control, though it is possible to generate an internal control signal activated/inactivated based on rise and fall of control signal RAS in the semiconductor device based on output signals from respective taps of common delay circuits 410 and 510.

Figure 12:
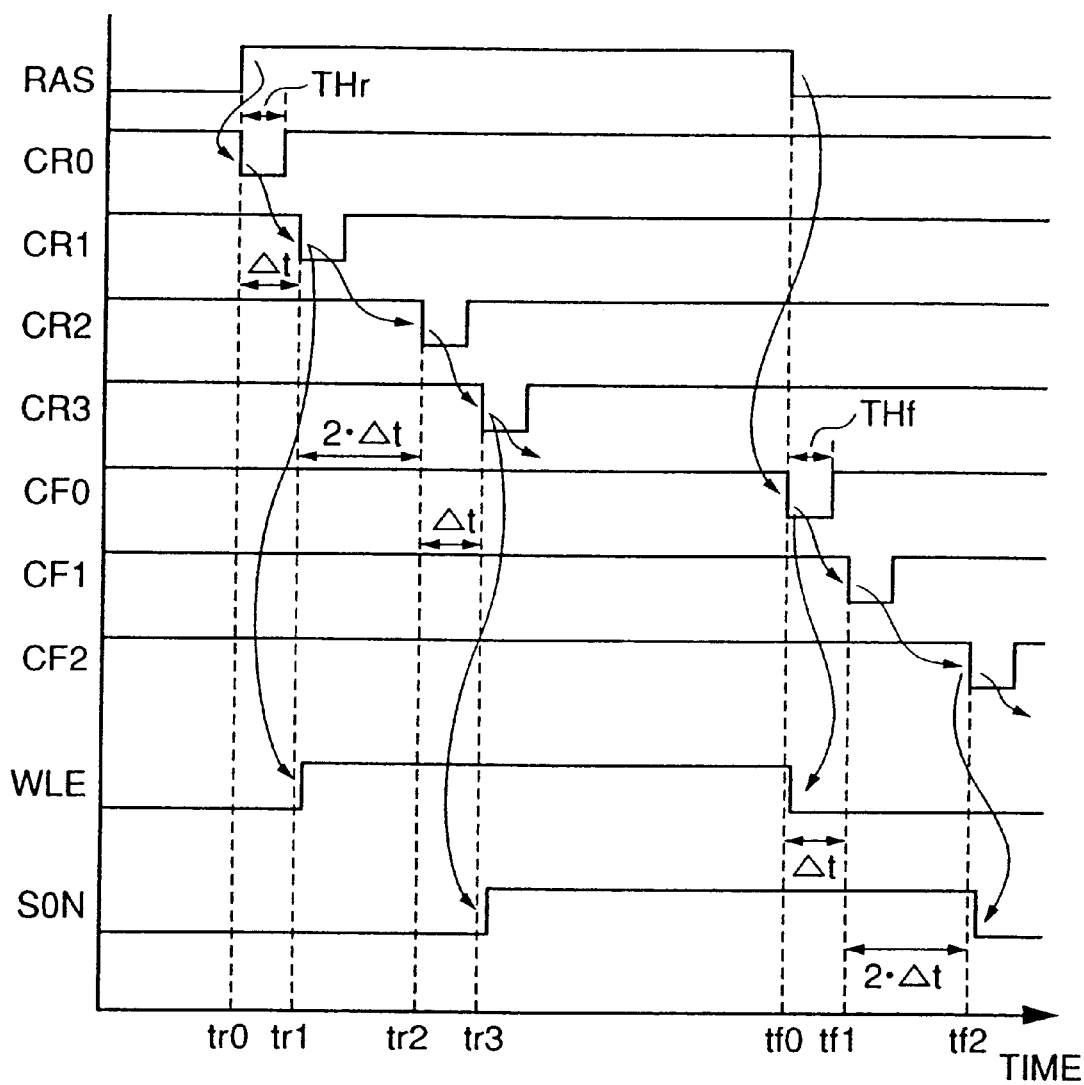
FIG. 12 is a timing chart referenced for describing an operation of a control signal generation circuit according to the fifth embodiment.

With reference to FIG. 12, at time tr0 corresponding to a rise of control signal RAS, pulse signal generation circuit 425 outputs a one-shot pulse with a pulse width THr to tap CR0. The one-shot pulse output to tap CR0 is delayed by delay circuits 412, 414, 416 and 418. At time tr1, which is delay time Δ·t of delay circuit 412 after time tr0, a signal level of tap CR1 falls to an L level and returns again to an L level after time period THr.

At time tr2, which is delay time 2·Δt of delay circuit 414 after time tr1, the signal level of tap CR2 turns to an L level and returns again to an H level THr after time tr2. Similarly, at time tr3, which is delay time Δt of delay circuit 416 after time tr2, the signal level of tap CR3 turns to an L level and returns again to an H level after THr.

Word line activation signal WLE is set in response to the change (H level→L level) in the signal level of tap CR1 connected to input node N6 and activated to an H level. Similarly, sense amplifier activation signal S0N is set in response to the change (H level→L level) in the signal level of tap CR3 connected to input node N8 and activated to an H level.

On the other hand, at time tf0 corresponding to a fall of control signal RAS, pulse signal generation circuit 525 outputs a one-shot pulse with pulse width THf to tap CF0. The one-shot pulse output to tap CF0 is transmitted to tap CF1 at time tf1, which is delay time Δt of delay circuit 512 later. Similarly, the signal level of tap CF2 changes to an L level at time tf2, which is delay time 2·Δt of delay circuit 514 after time tf1 and returns again to an H level after THf Word line activation signal WLE is reset in response to the change (H level→L level) of the signal level of tap CF0 connected to input node N7 and inactivated to an L level. Similarly, sense amplifier activation signal S0N is reset in response to the change (H level→level) of the signal level of tap CF2 connected to input node N9 and inactivated to an L level.

As can be seen from the foregoing, it becomes possible to share the common delay circuit among the plurality of control circuits for generating a series of internal control signals to be activated/inactivated after an elapse of predetermined time period in response to rise and fall of the control signal which serves as a reference. Thus, the control signal for the row-related operation in the semiconductor device, for example, can be generated.

The adjustment of the timing of activation/inactivation of each internal control signal through common delay circuits 410 and 510 can be readily performed through the change in connection between terminal provided for each tap and an input node of the control circuit.

With such structure, the layout area will not be increased from the increase in the number of delay circuits even if the number of internal control signals to be generated in response to rise and fall of the control signal which selves as a reference. In addition, the variation in delay time caused from the variation in the layout will have little effect because the delay circuit is shared.

In addition, when the technique described with reference to the fourth embodiment is combined with the technique of this embodiment to form a structure in which a signal driver is provided for an output of each tap, the timing accuracy of each delay signal can be further improved.

Figure 13:
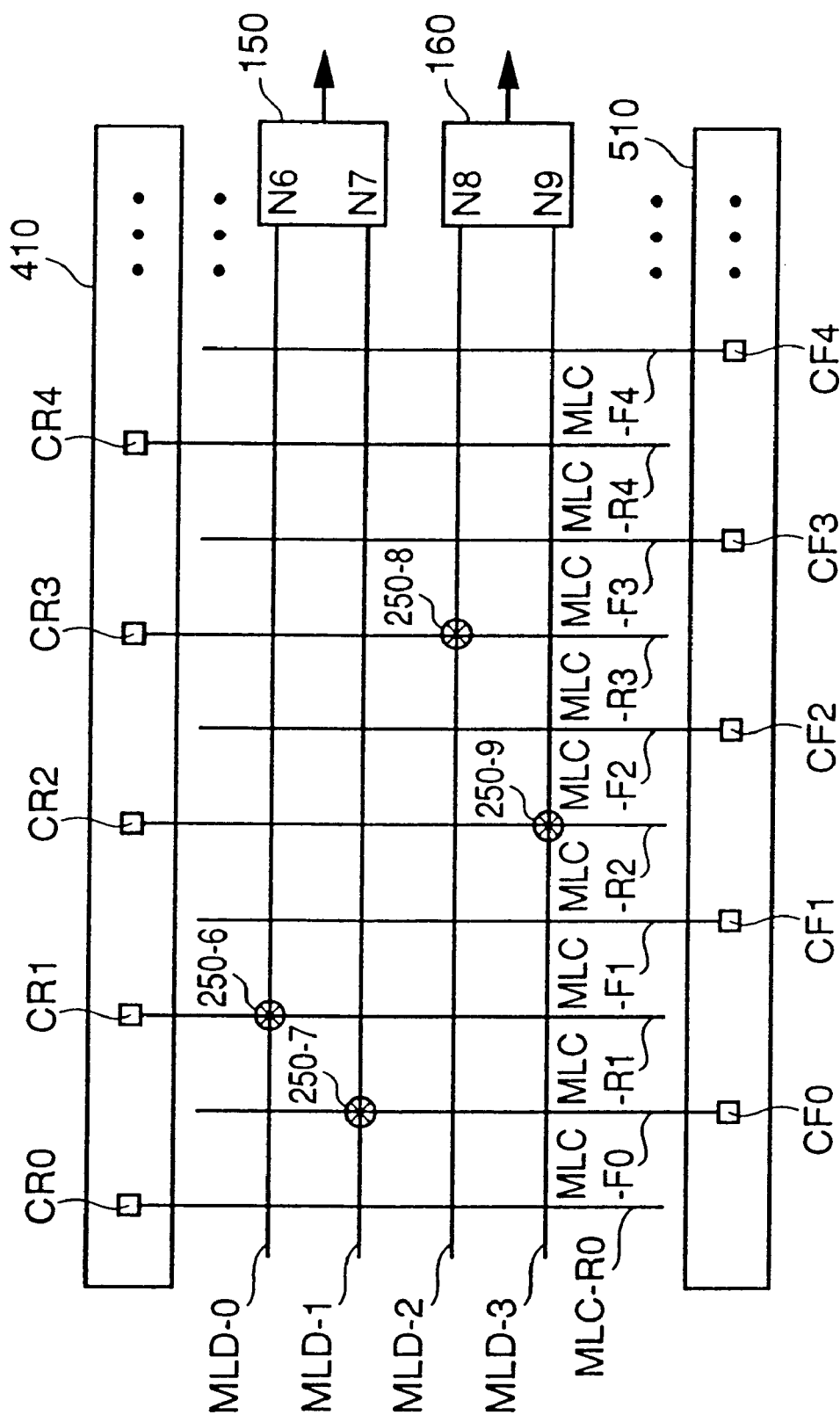
FIG. 13 is a conceptual diagram showing an exemplary arrangement of a control signal generation circuit according to the fifth embodiment.
Figure 14:
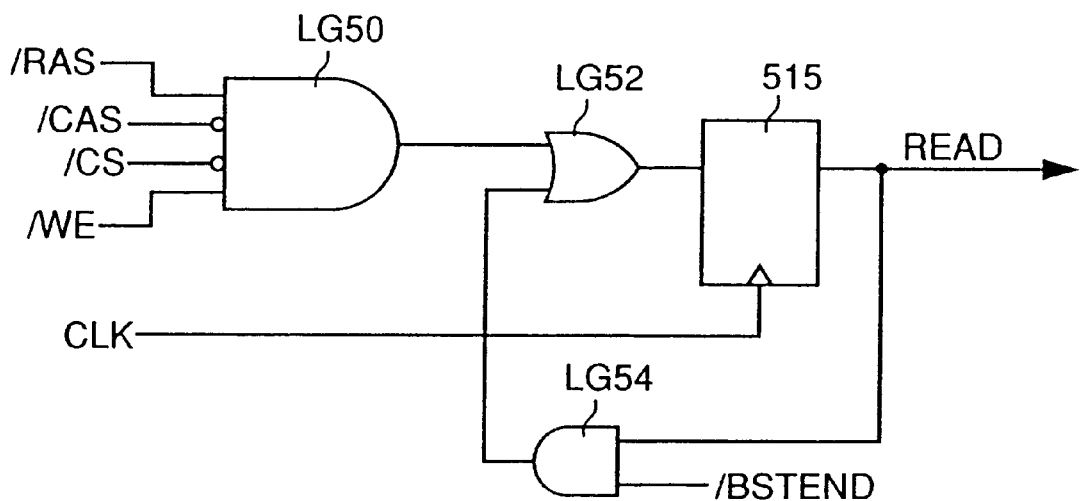
FIG. 14 is a circuit diagram showing a structure of a control signal generation circuit 510 generating a read command signal in a DRAM.
Figure 15:
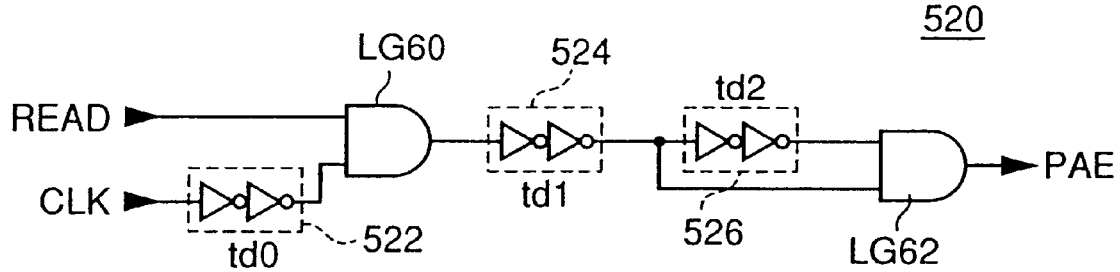
FIG. 15 is a circuit diagram showing a structure of a control signal generation circuit 520 according to the conventional art.
Figure 16:
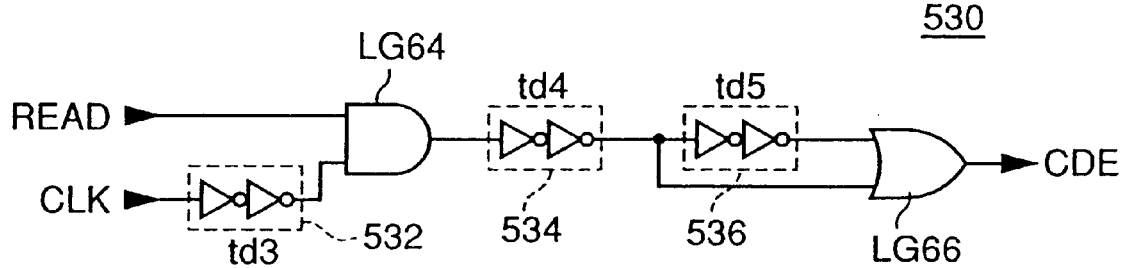
FIG. 16 is a circuit diagram showing a structure of a control signal generation circuit 530 according to the conventional art.
Figure 17:
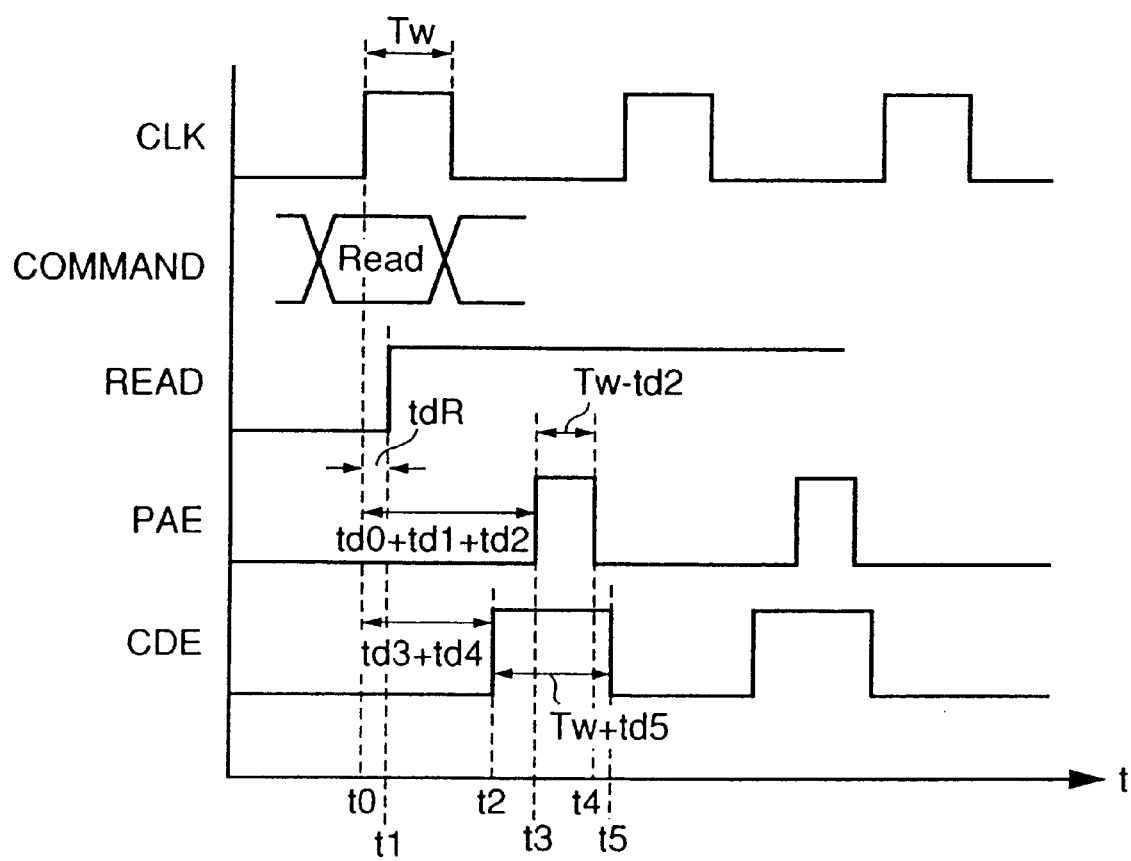
FIG. 17 is a timing chart referenced for describing operations of control signal generation circuits 520 and 530.

In FIG. 13, an exemplary arrangement of the control signal generation circuit shown in FIG. 11 is shown.

In FIG. 13, the arrangement of the control signal generation circuit shown in FIG. 6 is applied to the control signal generation circuit according to the fifth embodiment.

With reference to FIG. 13, provided are lines MLC-R0~MLC-R4 connected to taps CR0~CR4 of common delay circuit 410, respectively, lines MLC-F0~MLC-F4 connected to taps CF0~CF4 of common delay circuit 510, respectively, and lines MLD-0~MLB-3 connected to input nodes N6~N8 of control circuits 150 and 160, respectively.

Lines MLC-R0~MLC-R4, MLC-F0~MLC-F4 and MLD-0~MLD-3 are formed as two-layer wiring on the semiconductor substrate. For example, lines MLC-R0~MLC-R4 and MLC-F0~MLC-F4, MLA-0~MLA-4 are first metal wiring for taking out the output signals from common delay circuits 410 and 510, and lines MLD-0~MLD-3 are second metal wiring formed in a second layer in a direction perpendicular to the extension of the first metal wiring. Lines can be connected through via holes (through holes) 250-6~250-9 provided in the interlayer insulation film at crossing points of lines to be connected.

When the control signal generation circuit is arranged according to the foregoing description, the connecting portion between respective taps of the common delay circuit and respective control circuits supplying the control signals can be efficiently formed on the semiconductor substrate.

In addition, for the connection of each tap and the control circuit, an electrical switching element can be used, applying the technique described with reference to the third embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a control signal generation circuit generating a plurality of internal control signals according to a control signal as a reference for performing a series of predetermined operations in said semiconductor device;
   said control signal generation circuit including,
   a delay circuit for delaying said control signal as a reference by a predetermined time period;
   said delay circuit including;
      a plurality of delay units connected in series, and
      a plurality of taps for taking out output signals from said plurality of delay units, respectively, and
   a plurality of signal generation circuits for supplying said plurality of internal control signals as outputs, respectively;
   each of said plurality of signal generation circuits setting a signal level of a corresponding one of said plurality of control signals according to signal levels of at least two of said plurality of delay signals supplied from said plurality of taps, respectively; further comprising:
      a plurality of first and second lines each arranged in a different wiring layer; wherein
      said plurality of first and second lines are arranged such that they cross each other,
      said plurality of first lines are electrically coupled to said plurality of taps, respectively, and
      said plurality of second lines are electrically coupled to input nodes of said plurality of signal generation circuits, respectively.

2. The semiconductor device according to claim 1 wherein
   one of said plurality of first lines and one of said plurality of second lines are electrically coupled via a hole formed in an interlayer insulation film provided between the wiring layers.

3. The semiconductor device according to claim 1 further comprising:
   a plurality of switches provided between said plurality of second lines and M (M is a natural number larger than 2) of said plurality of first lines, respectively; wherein
   said control signal generation circuit selectively turns on one of M switches corresponding to each of said plurality of second lines.

* * * * *